United States Patent
Ito et al.

(10) Patent No.: US 7,544,629 B2
(45) Date of Patent: Jun. 9, 2009

(54) NON-LEAD GLASS FOR FORMING DIELECTRIC, GLASS CERAMIC COMPOSITION FOR FORMING DIELECTRIC, DIELECTRIC, AND PROCESS FOR PRODUCING LAMINATED DIELECTRIC

(75) Inventors: Kazuhiro Ito, Yokohama (JP); Yasuko Osaki, Yokohama (JP); Katsuyoshi Nakayama, Yokohama (JP); Kazunari Watanabe, Yokohama (JP); Jiro Chiba, Yokohama (JP)

(73) Assignee: Asahi Glass Company, Limited, Tokyo (JP)

( * ) Notice: Subject to any disclaimer, the term of this patent is extended or adjusted under 35 U.S.C. 154(b) by 277 days.

(21) Appl. No.: 11/251,960

(22) Filed: Oct. 18, 2005

(65) Prior Publication Data

US 2006/0052231 A1    Mar. 9, 2006

Related U.S. Application Data

(63) Continuation of application No. PCT/JP2004/005201, filed on Apr. 12, 2004.

(30) Foreign Application Priority Data

Apr. 21, 2003 (JP) ............................. 2003-116026

(51) Int. Cl.
C03C 1/00 (2006.01)
C03C 14/00 (2006.01)
C03C 10/06 (2006.01)
C03C 10/02 (2006.01)
C03C 8/14 (2006.01)
C04B 35/00 (2006.01)

(52) U.S. Cl. ............................. 501/32; 501/8; 501/10; 501/17; 501/137; 501/138; 501/139

(58) Field of Classification Search .................. 501/32, 501/8, 17, 10, 137, 138, 139
See application file for complete search history.

(56) References Cited

U.S. PATENT DOCUMENTS

| | | | | |
|---|---|---|---|---|
| 4,624,934 A | * | 11/1986 | Kokubu et al. ............... | 501/17 |
| 5,763,339 A | * | 6/1998 | Asada et al. .................. | 501/17 |
| 6,184,165 B1 | * | 2/2001 | Kawata ....................... | 501/32 |
| 6,458,734 B1 | * | 10/2002 | Sugimoto et al. ............ | 501/139 |
| 6,579,818 B2 | * | 6/2003 | Kawai et al. ................. | 501/32 |
| 6,852,655 B2 | * | 2/2005 | Kodera et al. ................ | 501/32 |
| 7,368,408 B2 | * | 5/2008 | Mori et al. .................... | 501/134 |
| 2004/0009863 A1 | * | 1/2004 | Furuse et al. ................. | 501/5 |
| 2004/0242402 A1 | * | 12/2004 | Ito et al. ....................... | 501/137 |
| 2006/0052231 A1 | | 3/2006 | Ito et al. | |

FOREIGN PATENT DOCUMENTS

| | | |
|---|---|---|
| JP | 7-118060 | 5/1995 |
| JP | 9-208258 | 8/1997 |
| JP | 2000-1330 | 1/2000 |
| JP | 2001-284807 | 10/2001 |
| JP | 2001-342057 | 12/2001 |
| JP | 2002-338295 | 11/2002 |
| JP | 2003-002682 | * 1/2003 |
| JP | 2003-2682 | 1/2003 |
| JP | 2003-40670 | 2/2003 |

OTHER PUBLICATIONS

U.S. Appl. No. 12/133,038, filed Jun. 4, 2008, Honoda et al.
U.S. Appl. No. 12/138,062, filed Jun. 12, 2008, Fujimine et al.

* cited by examiner

*Primary Examiner*—Jerry Lorengo
*Assistant Examiner*—Matthew E Hoban
(74) *Attorney, Agent, or Firm*—Oblon, Spivak, McClelland, Maier & Neustadt, P.C.

(57) ABSTRACT

A non-lead glass for forming a dielectric, which consists essentially of, as represented by mol %, from 20 to 39% of $SiO_2$, from 5 to 35% of $B_2O_3$, from 2 to 15% of $Al_2O_3$, from 1 to 25% of CaO+SrO, from 5 to 25% of BaO, from 0 to 35% of ZnO, and from 0 to 10% of $TiO_2+ZrO_2+SnO_2$, provided that $B_2O_3$+ZnO is from 15 to 45%, and which does not contain alkali metal oxides, or contains such oxides in a total amount within a range of less than 1%. Further, a glass ceramic composition for forming a dielectric, which consists essentially of a Ba-containing compound powder and a powder of the above mentioned non-lead glass for forming a dielectric. Further, a dielectric obtained by firing the above glass ceramic composition for forming a dielectric.

14 Claims, No Drawings

NON-LEAD GLASS FOR FORMING DIELECTRIC, GLASS CERAMIC COMPOSITION FOR FORMING DIELECTRIC, DIELECTRIC, AND PROCESS FOR PRODUCING LAMINATED DIELECTRIC

CROSS-REFERENCE TO A RELATED APPLICATION

The present application is a continuation of International Application PCT/JP04/005201, filed Apr. 12, 2004, which claims priority to Japanese Patent Application No. 2003-116026 filed Apr. 21, 2003.

BACKGROUND OF THE INVENTION

1. Field of the Invention

The present invention relates to a glass and a glass ceramic composition, which are suitable for forming a dielectric by low temperature firing, a dielectric suitable for e.g. a substrate for e.g. an antenna or circuit to be used in a high frequency region, and a process for producing a laminated dielectric suitable for such a substrate.

2. Discussion of Background

A dielectric is employed for a substrate for e.g. a resonant filter or an antenna to be used in a high frequency region, and such a dielectric is required to have a high dielectric constant. Many glasses have been proposed as such dielectric materials (e.g. Tables 1 and 2 in JP-A-7-118060).

Such a dielectric having a high dielectric constant may, for example, be laminated with a dielectric having a low dielectric constant for use as a circuit board (e.g. JP-A-2001-284807).

In recent years, such a dielectric material is required to be capable of being fired at a low temperature (for example, capable of being fired at a temperature of at most 900° C.), to contain no lead and further to have a low content of alkali metal oxides in order to improve electrical insulation properties.

It is an object of the present invention to provide a non-lead glass for forming a dielectric, a glass ceramic composition for forming a dielectric, and a dielectric, which are capable of satisfying such requirements.

Further, in a case where a layer having a high dielectric constant and a layer having a low dielectric constant are to be laminated, it is conceivable, as disclosed in JP-A-2001-284807, to adopt a method of laminating and unifying layers having mutually different compositions, followed by firing. However, layers having different compositions may usually take different firing shrinkage behaviors in many cases, and have had a problem such that interlaminar peeling, deformation or the like is likely to result.

It is another object of the present invention to provide a process for producing a laminated dielectric which is capable of solving such a problem.

SUMMARY OF THE INVENTION

The present invention provides a non-lead glass for forming a dielectric, which consists essentially of, as represented by mol % based on the following oxides, from 20 to 39% of $SiO_2$, from 5 to 35% of $B_2O_3$, from 2 to 15% of $Al_2O_3$, from 1 to 25% of CaO+SrO, from 5 to 25% of BaO, from 0 to 35% of ZnO, and from 0 to 10% of $TiO_2+ZrO_2+SnO_2$, provided that $B_2O_3$+ZnO is from 15 to 45%, and which does not contain alkali metal oxides, or contains such oxides in a total amount within a range of less than 1%.

Further, the present invention provides a glass ceramic composition for forming a dielectric, which consists essentially of a Ba-containing compound powder and a powder of the above non-lead glass for forming a dielectric.

Further, the present invention provides a dielectric obtained by firing the above glass ceramic composition for forming a dielectric.

Further, the present invention provides a process for producing a laminated dielectric, which is a process for producing a laminated dielectric having a high dielectric constant layer and a low dielectric constant layer laminated, which comprises laminating a high dielectric constant raw material layer comprising a glass ceramic composition to form a high dielectric constant layer having a relative dielectric constant of at least 15 at a frequency f of at least 1 MHz when fired and a low dielectric constant raw material layer comprising a glass ceramic composition to form a low dielectric constant layer having the same relative dielectric constant of less than 10 when fired, and firing them, wherein the glass ceramic composition to form the high dielectric constant layer is the glass ceramic composition for forming a dielectric as defined in the above glass ceramic composition, and the glass ceramic composition to form the above low dielectric constant layer consists essentially of an alumina powder and a powder of the non-lead glass for forming a dielectric as defined in the above non-lead glass for forming a dielectric.

The present inventors have attempted to obtain a dielectric having a high dielectric constant by mixing and firing a $BaTi_4O_9$ crystal powder having a high dielectric constant and a non-lead glass powder capable of being fired at a low temperature. However, it has been impossible to obtain a dielectric having the desired dielectric constant by using a conventional non-lead glass powder.

With respect to the dielectric thus obtained, which was not one having the desired dielectric constant, X-ray diffraction was carried out, whereby no presence of $BaTi_4O_9$ crystals was observed. The present inventors considered that this must be the direct cause whereby it was impossible to obtain a dielectric having the desired dielectric constant, and such a phenomenon could occur as a result such that the $BaTi_4O_9$ crystal powder and the non-lead glass reacted with each other during the firing, whereby the crystal powder disappeared. On this basis, the present invention has been accomplished.

DETAILED DESCRIPTION OF THE PREFERRED EMBODIMENTS

The glass ceramic composition for forming a dielectric of the present invention (hereinafter referred to as the glass ceramic composition of the present invention) is used for the production of a dielectric which typically has a relative dielectric constant ($\in$) of more than 15.5 at 25° C. at 50 MHz. Namely, the glass ceramic composition of the present invention is fired to a fired body which is a dielectric.

The glass ceramic composition of the present invention is preferably one whereby a dense desired fired body can be obtained even when it is fired at a temperature of at most 900° C. In such a case, it can be cofired at a temperature of at most 900° C. together with a low temperature cofiring ceramic (LTCC) substrate material or a low temperature firing electrode material such as a silver paste.

The firing is usually carried out at a temperature of from 800 to 900° C. for from 5 to 120 minutes. A more typical firing temperature is from 850 to 900° C.

In a case where it is cofired together with e.g. a silver paste to form silver or a silver-containing conductor on the surface or inner of the fired body, the firing temperature is preferably at most 890° C. If it exceeds 890° C., the silver or silver-containing conductor is likely to be softened during the firing, and the shape of the wiring pattern tends to be hardly maintained. It is more preferably at most 880° C., particularly preferably at most 870° C.

$\in$ of the dielectric obtained by firing the glass ceramic composition of the present invention, i.e. the dielectric of the present invention, is preferably more than 15.5, more preferably at least 17, particularly preferably at least 18. Further, $\in$ is typically at most 30.

Further, the relative dielectric constant ($\in_{20\ GHz}$) and the dielectric loss (tan $\delta_{20\ GHz}$) of the dielectric of the present invention at 25° C. at 20 GHz are preferably more than 15.5 and at most 0.0100, respectively. If $\in_{20\ GHz}$ is at most 15.5 or if tan $\delta_{20\ GHz}$ exceeds 0.0100, its application to e.g. a high frequency antenna is likely to be difficult.

$\in_{20\ GHz}$ is more preferably at least 17, particularly preferably at least 18. Further, $\in_{20\ GHz}$ is typically at most 30. Further, tan $\delta_{20\ GHz}$ is more preferably at most 0.0070, particularly preferably at most 0.0050, most preferably less than 0.0030.

Further, the relative dielectric constant ($\in_{25\ GHz}$) and the dielectric loss (tan $\delta_{25\ GHz}$) of the dielectric of the present invention at 25° C. at 25 GHz are preferably more than 15.5 and at most 0.0100, respectively. If $\in_{25\ GHz}$ is at most 15.5 or if tan $\delta_{25\ GHz}$ exceeds 0.0100, its application to e.g. a high frequency antenna is likely to be difficult.

$\in_{25\ GHz}$ is more preferably at least 17, particularly preferably at least 18. Further, $\in_{25\ GHz}$ is typically at most 30. Further, tan $\delta_{25\ GHz}$ is more preferably at most 0.0070, particularly preferably at most 0.0050, most preferably less than 0.0030.

Product Qf of reciprocal Q of the above dielectric loss tan $\delta$ at a frequency f, multiplied by f, is preferably at least 2,800, more preferably at least 6,700.

The average temperature change rate ($\tau_\in$) within a range of from −25° C. to +80° C. of the relative dielectric constant at 50 MHz of the dielectric of the present invention, is preferably from −90 to +70 ppm/° C., more preferably from −50 to +30 ppm/° C. Here, for $\tau_\in$, the relative dielectric constant is measured at intervals of 1° C. from −25 to +80° C., and the temperature-relative dielectric constant curve thereby obtained, is linearly regressed, whereupon the inclination of the linear line is divided by $\in$ to obtain $\tau_\in$.

In the dielectric of the present invention, a Ba-containing compound crystal which contains Ti in addition to Ba, wherein the Ti/Ba molar ratio is from 3.5 to 5.0, or a $BaTi_4O_9$ crystal, is preferably present. If neither one of these crystals is present, for example, $\in_{20\ GHz}$ tends to be small, or tan $\delta_{20\ GHz}$ is likely to be large.

In the dielectric of the present invention, crystals other than the above-mentioned crystals may be present within a range not to impair the purpose of the present invention.

For example, in the dielectric of the present invention, gahnite or corundum is preferably present in a case where it is desired to increase the mechanical strength, and celsian ($BaAl_2Si_2O_8$ crystals) or hexacelsian ($BaAl_2Si_2O_8$ crystals) is preferably present in a case where it is desired to reduce the dielectric loss at the same time as increasing the mechanical strength.

As other crystals which may be present in the dielectric of the present invention, $BaTi_5O_{11}$ crystals, $Ba_2Ti_9O_{20}$ crystals, $BaWO_4$ crystals or rutile ($TiO_2$ crystals) may, for example, be mentioned.

In a case where the dielectric of the present invention is to be used, for example, as a high frequency antenna, it may be formed into a substrate shape for use as a patch antenna, or it may be formed into a rod shape or cavity shape for use as a rod type or cavity type antenna.

A substrate made of the dielectric of the present invention is useful, for example, as a substrate for a high frequency patch antenna. In such a substrate, such as an antenna substrate, it is preferred that the above mentioned Ba-containing compound crystals or $BaTi_4O_9$ crystals are present, each of $\in$ and $\in_{20\ GHz}$ is more than 15.5, and tan $\delta_{20\ GHz}$ is at most 0.0070, and tan $\delta_{20\ GHz}$ is more preferably less than 0.0030. Further, Qf of the same substrate is preferably at least 2,800, more preferably at least 6,700.

The non-lead glass for forming a dielectric of the present invention (hereinafter referred to as the glass of the present invention) is usually formed into a powder, and such a powder is suitable as a component for the glass ceramic composition of the present invention. However, the application of the glass of the present invention is not limited thereto.

The softening point Ts of the glass of the present invention is preferably at most 800° C. If Ts exceeds 800° C., when a ceramic powder such as a $BaTi_4O_9$ crystal powder is added to a powder of the glass of the present invention, followed by firing at a temperature of at most 900° C., a dense fired body may not be obtained.

Further, in a case where a powder of the glass of the present invention is to be used for the glass ceramic composition of the present invention, if Ts exceeds 800° C., the content of such a powder is required to be increased, and consequently, the dielectric constant of the dielectric of the present invention is likely to be small, or the dielectric loss is likely to be large. Ts is more preferably at most 780° C. Further, as mentioned above, if it is desired to obtain a dense fired body even by firing at a temperature of at most 880° C., Ts is preferably at most 770° C., more preferably at most 760° C.

Now, the composition of the glass of the present invention will be described, wherein "mol %" will be referred to simply as "%".

$SiO_2$ is a network former for the glass and essential. If $SiO_2$ is less than 20%, vitrification tends to be difficult, and it is preferably at least 30%. If $SiO_2$ exceeds 39%, Ts tends to be high, whereby firing at a temperature of at most 900° C. tends to be difficult, or the relative dielectric constant of the fired body tends to be small, and it is preferably at most 36%, more preferably at most 35%.

$B_2O_3$ has an effect to stabilize the glass or to lower Ts and essential. If $B_2O_3$ is less than 5%, such an effect is small, and it is preferably at least 11%. If it exceeds 35%, the chemical stability of the glass is likely to deteriorate, and it is preferably at most 28%.

$Al_2O_3$ has an effect to stabilize the glass or to increase the chemical durability and essential. If $Al_2O_3$ is less 2%, such an effect is small, and it is preferably at least 4%, more preferably at least 6%. If it exceeds 15%, Ts tends to be high, and it is preferably at most 12%, more preferably at most 8%.

CaO and SrO have effects to stabilize the glass, and at least one of them is required to be contained. If the total content of CaO and SrO is less than 1%, the above-mentioned effects tend to be small, and the total content is preferably at least 5%, more preferably at least 6%. However, if it exceeds 25%, the glass rather tends to be unstable, or the relative dielectric constant tends to be small, and it is preferably at most 20%, more preferably at most 17%.

CaO is preferably incorporated in an amount of at least 5%.

In a case where SrO is incorporated, its content is preferably at least 1%.

BaO is essential as a component incorporated for the purpose of letting Ba-containing compound crystals such as $BaTi_4O_9$ crystals remain in the dielectric obtainable by firing the glass ceramic composition of the present invention containing a Ba-containing compound powder such as a $BaTi_4O_9$ crystal powder. If BaO is less than 5%, the Ba-containing compound powder is likely to react with glass components during the firing, and Ba-containing compound crystals tend to hardly remain in the dielectric, whereby the relative dielectric constant of the dielectric tends to be small, or the dielectric loss tends to be large. Or, in a case where the Ba-containing compound powder is a $BaTi_4O_9$ crystal powder, the $BaTi_4O_9$ crystal powder is likely to react with glass components during the firing and, for example, be converted to rutile, and consequently, $\tau_\in$ is likely to be too small. BaO is preferably at least 7%, more preferably at least 10%. If BaO exceeds 25%, the glass tends to be unstable, or the dielectric loss tends to be large, and it is preferably at most 20%, more preferably at most 18%.

ZnO is not essential, but may be incorporated up to 35% to lower Ts or to stabilize the glass. If ZnO exceeds 35%, the chemical durability tends to deteriorate, or the glass rather tends to be unstable, and it is preferably at most 25%. In a case where ZnO is incorporated, its content is preferably at least 6%, more preferably at least 11%.

The total content of $B_2O_3$ and ZnO is from 15 to 45%. If such a total content is less than 15%, the glass tends to be unstable, or Ts tends to be high, and it is preferably at least 25%. If it exceeds 45%, the chemical durability tends to deteriorate, and it is preferably at most 40%, more preferably at most 35%.

Each of $TiO_2$, $ZrO_2$ and $SnO_2$ is not essential, but they may be incorporated in a total amount of up to 10% to increase $\in$ or to improve the chemical durability. If such a total amount exceeds 10%, at the time of firing in the form of a powder, the crystallization rate tends to be large, whereby sintering tends to be difficult, and densification of the fired body tends to be low, and the total amount is preferably at most 5%.

The glass of the present invention consists essentially of the above-described components, but may contain other components in order to e.g. to lower Ts or to color the glass within a range not to impair the purpose of the present invention. In a case where the glass of the present invention contains such other components, their total content is preferably at most 10%. If such a total content exceeds 10%, the glass tends to be unstable, and it is more preferably less than 5%.

As such other components, MgO, $P_2O_5$, $Y_2O_3$, $Ga_2O_3$, $In_2O_3$, $Ta_2O_5$, $Nb_2O_5$, $CeO_2$, $La_2O_3$, $Sm_2O_3$, $MoO_3$, $WO_3$, $Fe_2O_3$, MnO, CuO, CoO and $Cr_2O_3$ may, for example, be mentioned.

Further, it is preferred not to contain alkali metal oxides such as $Li_2O$, $Na_2O$ and $K_2O$, since the electrical insulating property is likely to be thereby deteriorated, or if alkali metal oxides are contained, the total content of such oxides is preferably less than 1%.

Further, the glass of the present invention contains no PbO.

Now, the composition of the glass ceramic of the present invention will be described on the basis of mass percentage.

The Ba-containing compound powder is essential as a component incorporated for the purpose of increasing the relative dielectric constant of the sintered product and reducing the dielectric loss. The Ba-containing compound is not limited to crystals and may be a solid solution. For example, $BaTi_4O_9$ crystals, $BaTi_5O_{11}$ crystals, $Ba_2Ti_9O_{20}$ crystals, $BaZrO_3$ crystals, $BaWO_4$ crystals, $BaSmTi_5O_{14}$ crystals, a $Ba(Ti,Zr)O_3$ solid solution, a $Ba(Zr,Zn,Ta)O_3$ solid solution and a $(BaO,Sm_2O_3)4TiO_2$ solid solution may be mentioned.

The Ba-containing compound preferably is or preferably contains $BaTi_4O_9$ crystals having such characteristics that the relative dielectric constant is large and the dielectric loss is small, in the high frequency region.

The $BaTi_4O_9$ crystal powder may be prepared, for example, as follows. Namely, a powder mixture comprising a barium carbonate powder and a titanium oxide powder in a Ba/Ti molar ratio within a range of from 3.5 to 4.5, is pulverized by e.g. a ball mill to obtain a pulverized powder mixture. The obtained pulverized powder mixture is maintained at a temperature of from 1,000 to 1,500° C. to react the barium carbonate powder with the titanium oxide powder. Such a maintaining temperature is preferably from 1,050 to 1,250° C. In the X-ray diffraction pattern of the powder thus prepared (hereinafter referred to as the BT powder), a diffraction peak pattern of $BaTi_4O_9$ crystals will be observed.

Further, with the BT powder, diffraction peak patterns of crystals other than the $BaTi_4O_9$ crystals, such as $Ba_2Ti_9O_{20}$ crystals, $BaTi_5O_{11}$ crystals and $TiO_2$ crystals, may sometimes be observed.

The Ba-containing compound powder may contain a powder of a compound containing Ti, in addition to Ba and the Ti/Ba molar ratio in the compound is preferably from 3.5 to 5.0.

The Ba-containing compound powder is more preferably the BT powder.

The Ba-containing compound powder preferably has a mass average particle size ($D_{50}$) of from 0.5 to 15 μm. If $D_{50}$ exceeds 15 μm, it tends to be difficult to obtain a dense fired body, and it is more preferably at most 10 μm, particularly preferably at most 5 μm.

The content of the Ba-containing compound powder is preferably from 25 to 75%. If the content is less than 25%, the relative dielectric constant of the fired body is likely to be small, and it is more preferably at least 35%, particularly preferably at least 45%. Further, if it exceeds 75%, a dense fired body tends to be hardly obtainable, and it is more preferably at most 65%.

A powder of the glass of the present invention is essential as a component to increase the densification of the fired body.

The content of the powder of the glass of the present invention is preferably from 25 to 75%. If the content is less than 25%, a dense fired body tends to be hardly obtainable, and it is more preferably at least 35%. Further, if it exceeds 75%, the relative dielectric constant tends to be small, the dielectric loss tends to be large, or $\tau_\in$ is likely to be large, and it is more preferably at most 65%, particularly preferably at most 55%.

$D_{50}$ of the powder of the glass of the present invention is preferably from 0.5 to 20 μm. If $D_{50}$ exceeds 20 μm, a dense fired body tends to be hardly obtainable, and it is more preferably at most 15 μm, more preferably at most 7 μm, particularly preferably at most 5 μm. Further, it is preferably at least 1 μm, more preferably at least 2 μm.

The glass ceramic composition of the present invention consists essentially of the above-described components, but may contain other components within a range not to impair the purpose of the present invention. Such other components preferably contain no lead, and their total content is preferably at most 20%, more preferably at most 10%.

For example, as such other components, at least one type of crystal powder selected from the group consisting of $MgTiO_3$, $CaTiO_3$, $SrTiO_3$ and $TiO_2$, may be incorporated for the purpose of e.g. increasing the relative dielectric constant or adjusting $\tau_\in$. In such a case, their total content is preferably from 0.1 to 20%, typically from 0.5 to 10%. In a case where it is desired to increase $\tau_\in$, at least one type of crystal powder selected from the group consisting of MgTiO$_3$, CaTiO$_3$ and SrTiO$_3$ is preferably incorporated; in a case where it is desired to reduce $\tau_\in$, a TiO$_2$ crystal powder is preferably incorporated, and in a case where it is desired to increase the densification or crystallinity of the fired body, a powder of e.g. MgO or ZrO$_2$, is preferably incorporated.

The glass ceramic composition of the present invention may be formed into a green sheet to be used for the preparation of a dielectric. In such a case, the glass ceramic composition of the present invention may be mixed with a resin component such as a polyvinyl butyral or an acrylic resin, a solvent such as toluene, xylene, butanol or propanol, as the case requires, a plastisizer such as dibutyl phthalate, dioctyl phthalate, butylbenzyl phthalate or triethylene glycol, or a dispersant to form a slurry. Then, this slurry is applied on a film of e.g. polyethylene telephthalate by e.g. a doctor blade method and dried to obtain a green sheet.

Now, a process for producing a laminated dielectric of the present invention (hereinafter referred to as the process of the present invention) will be described.

The process of the present invention is useful typically for the production of a laminated dielectric to be used for a small size antenna substrate which is used in a high frequency region of e.g. from 1 GHz to 30 GHz.

Such a small size antenna substrate may, for example, be a laminated dielectric having four layers of a low dielectric constant layer, a high dielectric constant layer, a high dielectric constant layer and a low constant dielectric layer laminated in this order, wherein a radiant conductor layer is formed between the high dielectric layer being the second layer and the high dielectric layer being the third layer.

In a case where the laminated dielectric is used for e.g. an antenna suitable for a wireless communication technique so-called an ultrawide band transmission system, the above-mentioned frequency f is typically within a range of from 3 GHz to 12 GHz, the relative dielectric constant ($\in_f$) at f of the high dielectric constant layer is from 15 to 23, and $\in_f$ of the low dielectric constant layer is from 5 to 9. $\in_f$ of the high dielectric constant layer and the low dielectric constant is layer is more preferably from 17 to 22 and from 6 to 8, respectively.

Each of the high dielectric constant raw material layer and the low dielectric constant raw material layer is typically a green sheet as mentioned above, but is not limited thereto, and, for example, be a glass paste obtainable by mixing the glass ceramic composition with a vehicle.

The glass ceramic composition which will be a low dielectric constant layer when fired, preferably has a content of an alumina powder being from 25 to 75% and a content of a powder of the glass of the present invention being from 25 to 75%, as represented by mass percentage. More preferably, the content of the former is from 40 to 60%, and the content of the latter is from 40 to 60%.

In the process of the present invention, the same glass powder is used for the high dielectric constant raw material layer and the low dielectric constant raw material layer, whereby there will be no or substantially no problems caused from the difference of the glass powders i.e. deformation for peeling of the two layers attributable to the difference in the shrinkage behaviors of the two layers or a reaction between the two layers at the time of the firing.

EXAMPLES

Raw materials were prepared and mixed so that the composition would be as shown by mol % in lines for from SiO$_2$ to SnO$_2$ in Table 1, and the mixed raw materials were put into a platinum crucible and melted at a temperature of from 1,550 to 1,600° C. for 60 minutes. Then, the molten glass was discharged and cooled. The obtained glass was pulverized for from 20 to 60 hours by an alumina ball mill using ethyl alcohol as a solvent. In this manner, glass powders G1 to G5 were obtained. Here, melting of G5 was carried out at 1,650° C. for 60 minutes.

$D_{50}$ (unit:μm) of each glass powder was measured by means of laser diffraction type particle size analyzer (SALD2100, manufactured by Shimadzu Corporation), and the glass transition point Tg (unit:° C.), Ts (unit:° C.) and the crystallization peak temperature Tc (unit:° C.) were measured by means of a thermal analyzer (TG-DTA2000, manufactured by MacScience) by raising the temperature to 1,000° C. under a heating rate of 10° C/min. Here, Ts of G5 was not measured by this method, and no crystallization peak of G1, G2 or G5 was observed.

On the other hand, a BT powder was prepared as follows. Namely, 88 g of BaCO$_3$ (barium carbonate BW-KT, manufactured by Sakai Chemical Industry) and 130 g of TiO$_2$ (rutile type reagent, manufactured by Kanto Chemical) were mixed by a ball mill using water as a solvent, then dried and maintained at 1,150° C. for two hours. Then, pulverization was carried out by a ball mill for 60 hours to obtain a powder having $D_{50}$ of 0-9 μm. With respect to this powder, the X-ray diffraction measurement was carried out, whereby a strong diffraction peak pattern of BaTi$_4$O$_9$ crystals was observed, and thus, it was confirmed to be a BT powder.

TABLE 1

|  | G1 | G2 | G3 | G4 | G5 |
| --- | --- | --- | --- | --- | --- |
| SiO$_2$ | 31.7 | 34.5 | 34.5 | 55 | 65 |
| B$_2$O$_3$ | 21.5 | 21.5 | 17.0 | 5 | 25 |
| Al$_2$O$_3$ | 6.5 | 6.5 | 6.5 | 10 | 5 |
| CaO | 7.4 | 7.5 | 7.5 | 0 | 5 |
| SrO | 0 | 7.0 | 0 | 0 | 0 |
| BaO | 14.7 | 7.5 | 14.5 | 30 | 0 |
| ZnO | 15.4 | 15.5 | 20.0 | 0 | 0 |
| TiO$_2$ | 0 | 0 | 0 | 0 | 0 |
| ZrO$_2$ | 2.0 | 0 | 0 | 0 | 0 |
| SnO$_2$ | 0.6 | 0 | 0 | 0 | 0 |
| Tg | 603 | 604 | 602 | 675 | 617 |
| Ts | 722 | 745 | 722 | 853 | — |
| Tc | — | — | 861 | 903 | — |
| D$_{50}$ | 3.6 | 5.5 | 3.8 | 2.4 | 2.8 |

The respective powders in the proportions shown by mass percentage in lines for from glass powder to T powder in Table 2 were mixed to obtain a glass ceramic composition (Examples 1 to 8). As the glass powder, a powder of the glass shown in the line for "Type of glass" in Table 2, was used; as the MT powder, magnesium titanate powder MT, manufactured by Fuji Titanium Industry was used; as the CT powder, calcium titanate powder CT manufactured by Fuji Titanium Industry was used; and as the T powder, titanium oxide powder SR1, manufactured by Sakai Chemical Industry was used.

20 g of each of the glass ceramic compositions of Examples 1 to 8 was press-molded in a mold of 40 mm×40 mm. The molded products were subjected to firing for 60 minutes at 870° C. with respect to Examples 1 to 5, 7 and 8 and at 860° C. with respect to Example 6, to obtain fired bodies each having a thickness of about 6 mm.

With respect to the obtained fired bodies, $\in$, $\tau_\in$ (unit:ppm/° C.), $\in_{20\ GHz}$, and tan $\delta_{20\ GHz}$ were measured, and crystals present in the fired bodies were identified. The results are shown in Table 2 together with Qf.

$\in$, $\tau_\in$: A sintered product was cut into halves. Both the upper and lower surfaces of each half were ground and polished to a thickness of 1 mm, whereupon $\in$ and $\tau_\in$ were measured by means of an impedance analyzer (HP4291A, manufactured by Hewlett Packard) and a constant temperature tank.

$\in_{20\ GHz}$, $\tan \delta_{20\ GHz}$: A part of a fired body was processed into a cylindrical shape having a diameter of from 4.0 to 4.5 mm and a height of from 2.5 to 3.0 mm, and the relative dielectric constant and the dielectric loss at 20 GHz were measured by means of a network analyzer 8722ES, manufactured by Agilent Technology and a parallel flat conductor panel type dielectric resonance measuring system, manufactured by Keycom. Here, no measurement was carried out with respect to Examples 4, 7 and 8.

Crystals: A fired body was pulverized into a powder, and crystals were identified by the X-ray diffraction method. In the Table, A represents rutile, B $BaTi_4O_9$ crystals, C celsian, D hexacelsian, and E $Ba_2TiSi_2O_9$ crystals.

TABLE 2

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Type of glass | G1 | G1 | G3 | G2 | G3 | G1 | G4 | G5 |
| Glass powder | 40 | 41 | 40 | 39 | 40 | 38 | 50 | 40 |
| BT powder | 58 | 55 | 58 | 58 | 60 | 58 | 50 | 40 |
| MT powder | 2 | 0 | 0 | 3 | 0 | 2 | 0 | 20 |
| CT powder | 0 | 4 | 2 | 0 | 0 | 0 | 0 | 0 |
| T powder | 0 | 0 | 0 | 0 | 0 | 2 | 0 | 0 |
| Crystals | ABCD | ABCD | ABCD | ABCD | ABCD | ABCD | ABDE | A |
| $\in$ | 19.7 | 18.6 | 17.2 | 15.9 | 19.8 | 17.8 | 8.2 | 9.5 |
| $\tau_\in$ | −20 | +59 | +32 | −45 | +8 | −70 | +65 | −70 |
| $\in_{20\ GHz}$ | 18.3 | 15.8 | 18.8 |  | 21.9 | 19.7 |  |  |
| $\tan\delta_{20\ GHz}$ | 0.0027 | 0.0067 | 0.0070 |  | 0.0043 | 0.0029 |  |  |
| Qf | 7400 | 3000 | 2800 |  | 4600 | 6900 |  |  |

To 50 g of the mixed powder of Example 6, 15 g of an organic solvent (one having toluene, xylene, 2-propanol and 2-butanol mixed in a mass ratio of 4:2:2:1), 2.5 g of a plasticizer (di-2-ethylhexyl phthalate), 5 g of a resin (polyvinyl butyral PVK#3000K, manufactured by Denki Kagaku Kogyo K. K.) and 0.3 g of a dispersant (BYK180, manufactured by BYK Chemie) were mixed to obtain a slurry. This slurry was applied on a PET film by a doctor blade method and dried to obtain a green sheet (high dielectric constant green sheet=high dielectric constant raw material layer) having a thickness of 0.2 mm.

Further, in the same manner, a green sheet (a low dielectric constant green sheet=low dielectric constant raw material layer) having a thickness of 0.2 mm was obtained by using a glass ceramic composition comprising 45% of a powder of glass G1 and 55% of alumina powder (Sumicorundum AA2, manufactured by Sumitomo Chemical), as represented by mass percentage.

Here, with respect to the fired body obtained by firing such a green sheet being a low dielectric constant raw material layer, the relative dielectric constant at 25 GHz was measured as follows. Namely, the green sheet was cut to obtain 6 sheets of 50 mm×50 mm, which were laminated and pressed under 15 MPa for one minute. The obtained pressed product was maintained at 550° C. for 5 hours to decompose and remove the resin component and then fired by maintaining it at 860° C. for one hour, to obtain a fired body. Both the upper and lower surfaces of the obtained fired body was mirror-polished to obtain a sample having a thickness of 250 μm. With respect to this sample, the relative dielectric constant and the dielectric loss were measured by the above-mentioned network analyzer 8722ES and by a cavity resonance method using a 25 GHz cavity resonator and as a result, they were 7.6 and 0.0019, respectively.

Each of the high dielectric constant green sheet and the low dielectric constant green sheet was cut into four sheets each having a size of 40 mm×40 mm.

Then, two low dielectric constant green sheets, two high dielectric constant green sheets, two high dielectric constant green sheets and two low dielectric constant green sheets, were laminated in this order, to obtain a green sheet laminate. Further, on the upper surface on the second high dielectric constant green sheet, a silver paste pattern to form a radiant conductor when fired, was formed by a screen printing method.

The green sheet laminate was hot pressed at 80° C. for 5 minutes, then held at 550° C. for 5 hours to decompose and remove the resin component and then fired by maintaining it at 860° C. for one hour, to obtain a laminated dielectric. With the laminated dielectric, none of the interlaminar reaction, peeling of the dielectric layers and deformation of the dielectric layers, was observed.

INDUSTRIAL APPLICABILITY

According to the present invention, a dielectric having large $\in$ can be obtained by firing at a temperature of e.g. at most 900° C., and it is thereby possible to carry out simultaneous firing with a silver paste to form silver electrodes.

According to one embodiment of the present invention, it is possible to obtain a dielectric having a small average temperature change rate of the relative dielectric constant in a high frequency region, and according to another embodiment of the present invention, it is possible to obtain a dielectric having a small dielectric loss in a high frequency region.

When a laminated dielectric having a high dielectric constant layer and a low dielectric constant layer laminated, is produced by simultaneously firing raw material layers to form such respective layers, it is possible to prevent or minimize a reaction at the interface of the two layers, and further, it is possible to prevent or minimize peeling or deformation of the two layers due to a difference in shrinkage behaviors at the time of firing the two layers.

The entire disclosure of Japanese Patent Application No. 2003-116026 filed on Apr. 21, 2003 including specification, claims and summary is incorporated herein by reference in its entirety.

What is claimed is:

1. A glass ceramic composition for forming a dielectric, which consists essentially of a Ba-containing compound powder and a powder of a non-lead glass which glass consists essentially of, as represented by mol % based on the following oxides, from 20 to 39% of $SiO_2$, from 5 to 35% of $B_2O_3$, from 2 to 15% of $Al_2O_3$, from 1 to 25% of CaO+SrO, from 5 to 25% of BaO, from 0 to 35% of ZnO, and from 0 to 10% of $TiO_2+ZrO_2+SnO_2$, provided that $B_2O_3+ZnO$ is from 15 to 45%, and which does not contain alkali metal oxides, or contains such oxides in a total amount within a range of less than 1%, wherein the Ba-containing compound powder comprises a powder of a compound containing Ti, in addition to Ba, and the Ti/Ba molar ratio in said compound is from 3.5 to 5.0, wherein as represented by mass percentage, the content of the Ba-containing compound powder is from 25 to 75%, and the content of the powder of the non-lead glass is from 25 to 75%.

2. The glass ceramic composition for forming a dielectric according to claim 1, wherein the Ba-containing compound powder is a $BaTi_4O_9$ crystal powder.

3. The glass ceramic composition for forming a dielectric according to claim 1, wherein as represented by mass percentage, at least one crystal powder selected from the group consisting of $MgTiO_3$, $CaTiO_3$, $SrTiO_3$ and $TiO_2$, is contained in a total amount of from 0.1 to 20%.

4. A dielectric obtained by firing the glass ceramic composition for forming a dielectric according to claim 1.

5. The dielectric according to claim 4, wherein the Ba-containing compound powder is a $BaTi_4O_9$ crystal powder.

6. The dielectric according to clam 4, which has a relative dielectric constant of more than 15.5 at 25°C. at 50 MHz.

7. The dielectric according to clam 4, which has a relative dielectric constant of more than 15.5 and a dielectric loss of less than 0.0070 at 25° C. at 20 GHz.

8. The dielectric according to clam 4, wherein the average temperature change rate within a range of from −25 to +80° C. of the relative dielectric constant at 50 MHz is from −90 to +70 ppm/° C.

9. A process for producing a laminated dielectric having a high dielectric constant layer and a low dielectric constant layer laminated, which comprises laminating a high dielectric constant raw material layer comprising a glass ceramic composition to form a high dielectric constant layer having a relative dielectric constant of at least 15 at a frequency f of at least 1 MHz when fired and a low dielectric constant raw material layer comprising a glass ceramic composition to form a low dielectric constant layer having the same relative dielectric constant of less than 10 when fired, and firing them, wherein the glass ceramic composition to form the high dielectric constant layer is the glass ceramic composition as defined in clam 1, and the glass ceramic composition to form the above low dielectric constant layer consists essentially of an alumina powder and a powder of a non-lead glass consisting essentially of, in mol % based on the following oxides, from 20 to 39% of $SiO_2$, from 5 to 35% of $B_2O_3$, from 2 to 15% of $Al_2O_3$, from 1 to 25% of CaO+SrO, from 5 to 25% of BaO, from 0 to 35% of ZnO, and from 0 to 10% of $TiO_2+ZrO_2+SnO_2$, provided that $B_2O_3+ZnO$ is from 15 to 45%, and which does not contain alkali metal oxides, or contains such oxides in a total amount within a range of less than 1%.

10. The process for producing a laminated dielectric according to clam 9, wherein the glass ceramic composition to form the low dielectric constant layer has, as represented by mass percentage, a content of the alumina powder of from 25 to 75% and a content of the powder of the non-lead glass for forming a dielectric of from 25 to 75%.

11. The glass ceramic composition for forming a dielectric according to clam 1, wherein the non-lead glass contains from 0 to 10 mol % of MgO.

12. The glass ceramic composition for forming a dielectric according to clam 1, wherein the non-lead glass contains ZnO in an amount of at least 11 mol %.

13. The dielectric according to clam 4, wherein the non-lead glass contains from 0 to 10 mol % of MgO.

14. The dielectric according to clam 4, wherein the non-lead glass contains ZnO in an amount of at least 11 mol %.

* * * * *